United States Patent
Ledentsov et al.

(10) Patent No.: US 10,666,017 B2
(45) Date of Patent: May 26, 2020

(54) OPTOELECTRONIC DEVICE BASED ON A SURFACE-TRAPPED OPTICAL MODE

(71) Applicants: Nikolay Ledentsov, Berlin (DE); Vitaly Shchukin, Berlin (DE)

(72) Inventors: Nikolay Ledentsov, Berlin (DE); Vitaly Shchukin, Berlin (DE)

(73) Assignee: Vertically Integrated (VI) Systems GmbH, Berlin (DE)

( * ) Notice: Subject to any disclaimer, the term of this patent is extended or adjusted under 35 U.S.C. 154(b) by 0 days.

(21) Appl. No.: 16/364,180

(22) Filed: Mar. 26, 2019

(65) Prior Publication Data

US 2019/0222000 A1 Jul. 18, 2019

Related U.S. Application Data

(63) Continuation of application No. 15/040,965, filed on Feb. 10, 2016, now Pat. No. 10,283,937, and a
(Continued)

(51) Int. Cl.
*H01S 5/183* (2006.01)
*H01S 5/10* (2006.01)
(Continued)

(52) U.S. Cl.
CPC ........ *H01S 5/18302* (2013.01); *H01S 5/0215* (2013.01); *H01S 5/1021* (2013.01); *H01S 5/1035* (2013.01); *H01S 5/1833* (2013.01); *H01S 5/18311* (2013.01); *H01S 5/18313* (2013.01); *H01S 5/18333* (2013.01); *H01S 5/18352* (2013.01); *H01S 5/18361* (2013.01); *H01S 5/18377* (2013.01);
(Continued)

(58) Field of Classification Search
CPC .. H01S 5/1021; H01S 5/18311; H01S 5/1833; H01S 5/18333; H01S 5/18352; H01S 5/205; H01S 5/222; H01S 5/423; H01S 2301/166
See application file for complete search history.

(56) References Cited

U.S. PATENT DOCUMENTS

| | | | | |
|---|---|---|---|---|
| 4,871,690 A | * | 10/1989 | Holonyak, Jr. ........ | B82Y 20/00 438/36 |
| 2007/0290191 A1 | * | 12/2007 | Shuchukin ............ | H01L 33/105 257/14 |
| 2013/0034117 A1 | * | 2/2013 | Hibbs-Brenner ... | H01S 5/34326 372/45.01 |

* cited by examiner

*Primary Examiner* — Armando Rodriguez
(74) *Attorney, Agent, or Firm* — Gordon Rees Scully Mansukhani LLP

(57) ABSTRACT

An optoelectronic device employs a surface-trapped TM-polarized optical mode existing at a boundary between a distributed Bragg reflector (DBR) and a homogeneous medium, dielectric or air. The device contains a resonant optical cavity surrounded by two DBRs, and an additional DBR section on top supporting the surface-trapped mode. Selective chemical transformation, like selective oxidation, etching or alloy composition intermixing form a central core and a periphery having different vertical profiles of the refractive index. Therefore, the longitudinal VCSEL mode in the core is non-orthogonal to the surface-trapped mode in the periphery, and the two modes can be transformed into each other. Such transformation allows fabrication of a number of optoelectronic devices and systems like a single transverse mode VCSEL, an integrated optical circuit operating as an optical amplifier, an integrated optical circuit combining a VCSEL and a resonant cavity photodetector, etc.

27 Claims, 14 Drawing Sheets

Related U.S. Application Data continuation of application No. 13/771,875, filed on Feb. 20, 2013, now Pat. No. 10,243,330.

(51) Int. Cl.
*H01S 5/22* (2006.01)
*H01S 5/20* (2006.01)
*H01S 5/02* (2006.01)
*H01S 5/42* (2006.01)
*H01S 5/026* (2006.01)

(52) U.S. Cl.
CPC .............. *H01S 5/205* (2013.01); *H01S 5/222* (2013.01); *H01S 5/026* (2013.01); *H01S 5/18369* (2013.01); *H01S 5/423* (2013.01); *H01S 2301/166* (2013.01); *H01S 2301/176* (2013.01)

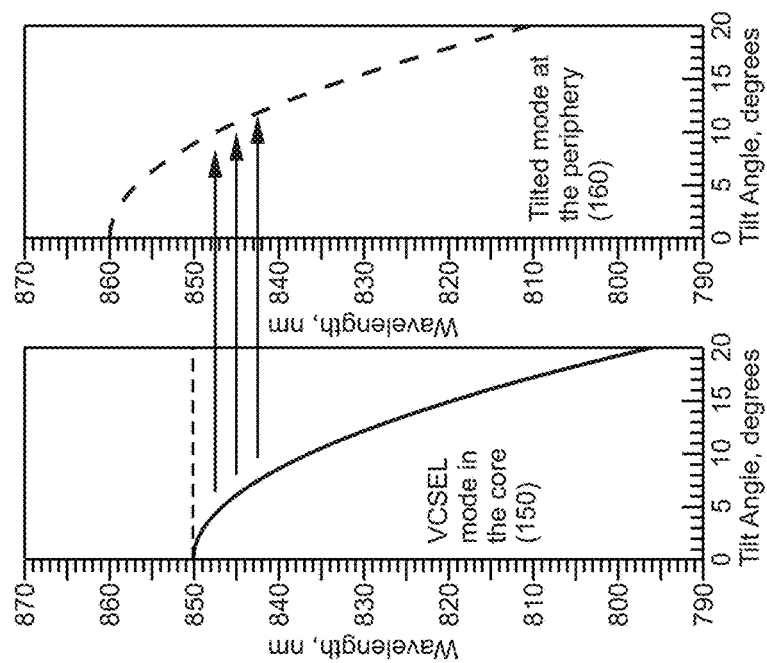
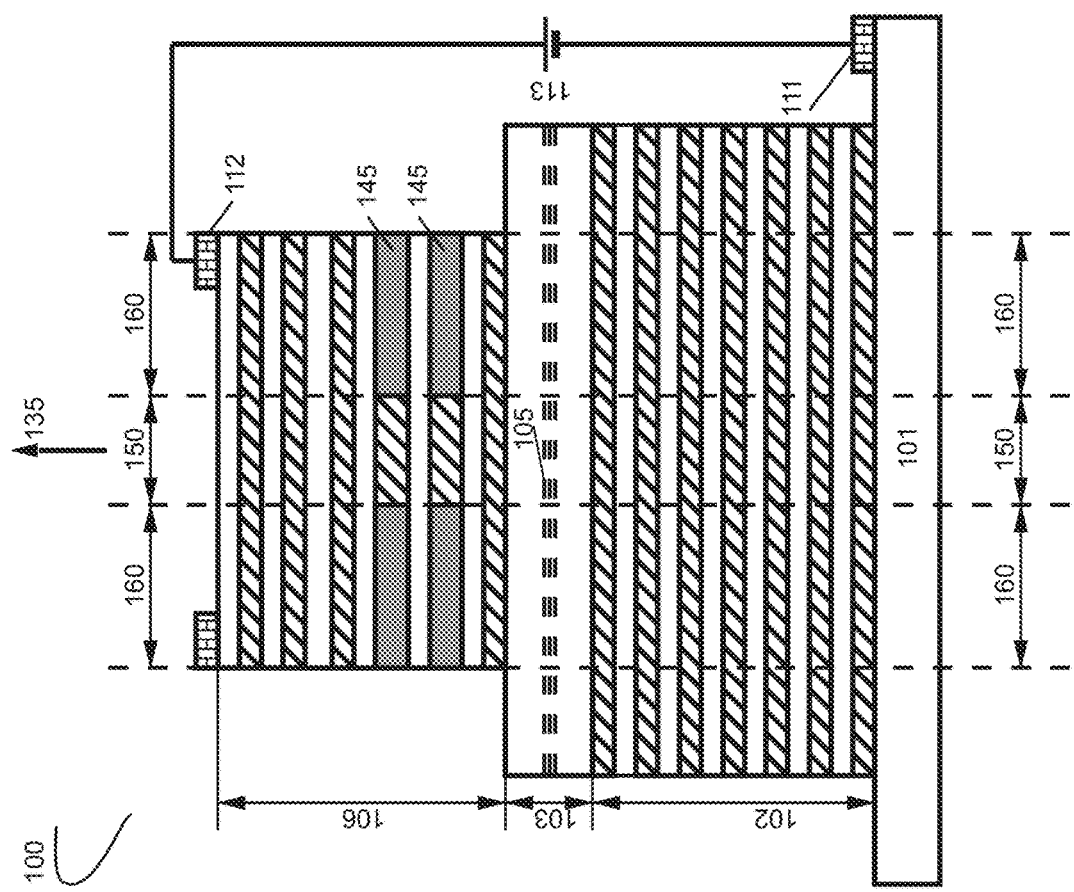
FIG. 1B.
FIG. 1A.

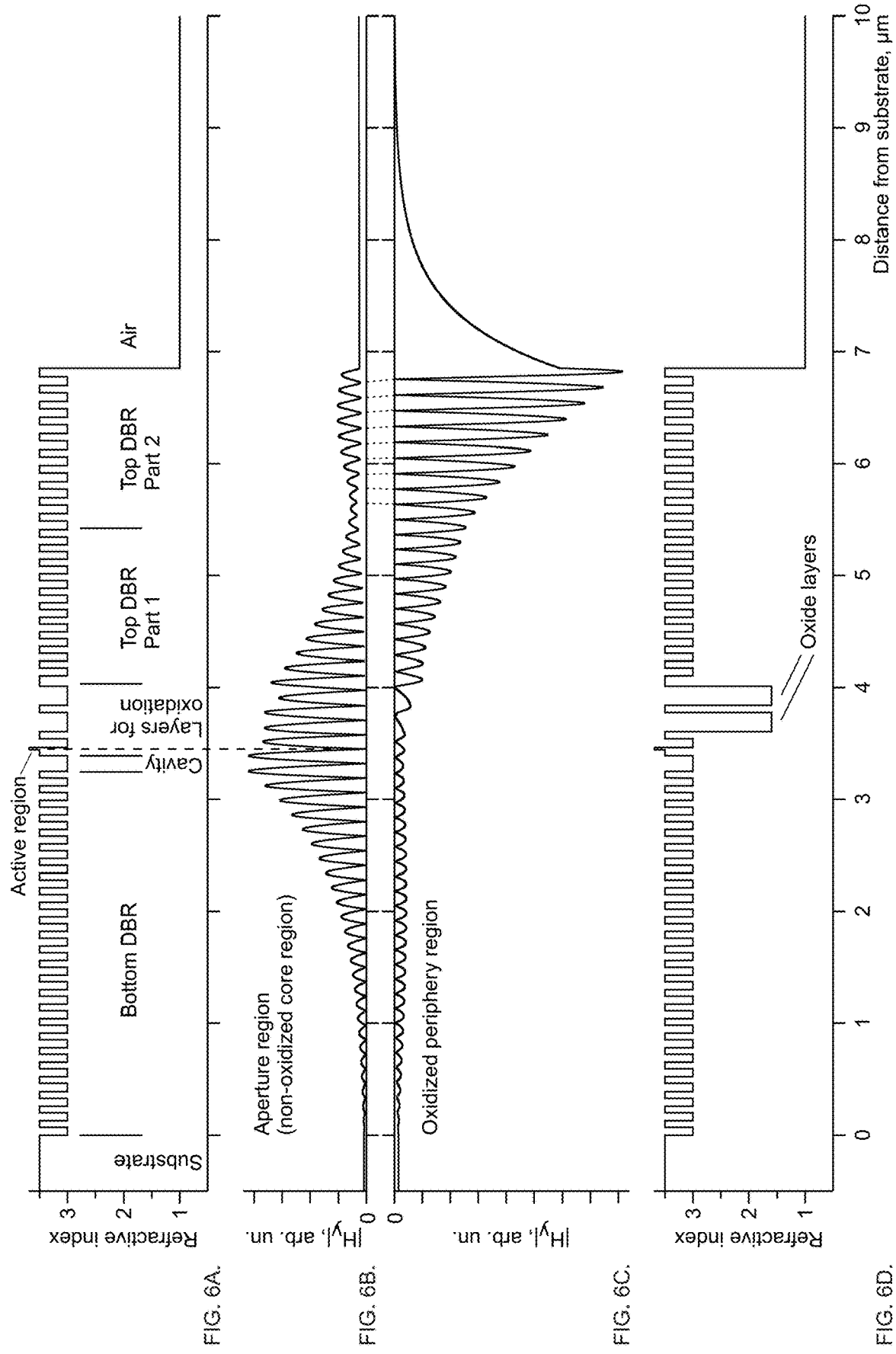

OPTOELECTRONIC DEVICE BASED ON A SURFACE-TRAPPED OPTICAL MODE

REFERENCE TO RELATED APPLICATIONS

This is a continuation-in-part of U.S. patent application Ser. No. 13/771,875, filed Feb. 20, 2013, entitled: "Optoelectronic Device with Resonant Suppression of High Order Optical Modes and Method of Making Same", and of U.S. patent application Ser. No. 15/040,965, filed Feb. 10, 2016, entitled "Optoelectronic Device with Enhanced Lateral Leakage of High Order Transverse Optical Modes into Alloy-Intermixing Regions and Method of Making Same". The aforementioned applications are hereby incorporated herein by reference.

BACKGROUND OF THE INVENTION

Field of the Invention

The invention pertains to the field of optoelectronic devices. More particularly, the invention pertains to light emitting devices.

Description of Related Art

Light-emitting devices are presently broadly used in multiple applications, particularly in lighting, projection displays, sensing, material processing, optical storage, optical data transmission and in other applications. In case of light emitting devices the light may be emitted in a single or in multiple modes at the same or at different wavelengths. The devices may be designed to emit in the fundamental or high order transverse modes. Conventional narrow-stripe edge-emitting double heterostructure laser is typically designed to emit in the fundamental transverse mode. As opposite broad area edge-emitting lasers or industrial surface-emitting lasers emit typically in multiple transverse modes. Edge emitting tilted cavity lasers or tilted wave lasers are unique as they may emit in a single vertical high order transverse mode having a significant contribution of the $\vec{k}$-vector in the direction perpendicular to the plane of the layers. Also in this case laterally multimode operation is possible if the width of the stripe is large. At the same time, to ensure sufficient power of the device it is of utmost importance to have large surface area of the excitation region to avoid gain saturation and thermal roll-over effects. Importance of the relation between the output power and single mode operation can be illustrated by the vertical-cavity surface-emitting laser (VCSEL). The device contains gain medium, which is either excited by current injection or by photopumping. If the aperture region, where the excitation region is placed, is small, the device can emit in a single transverse mode at a fixed wavelength with a well-defined shape of the light beam and the field intensity maximum in the direction perpendicular to the surface. Once the size of the aperture increases beyond some critical value, excited transverse modes appear. This phenomenon is well explained in multiple books on VCSELs (e.g., Wilmsen, C., Temkin, H., and Coldren, L. A., eds. [*Vertical Cavity Surface Emitting Lasers. Design, Fabrication, Characterization, and Applications*], Section 2.3; Cambridge University Press, (1999)). In case of the multimode operation the device emits at several wavelengths and with a complex far field pattern composed of multiple lobes oriented in different directions. These phenomena make focusing to a single spot of the light coming out of the device hardly possible and adversely affects multiple applications like optical data transmission. Thus, it makes efficient coupling to a single mode fiber questionable. Similar problems occur also in tilted cavity laser, tilted wave laser, passive cavity laser, near-field laser. To overcome the problem of low single mode power of the VCSEL in some applications multiple lasers on a single wafer having small apertures are used. This allows achieving very high single mode power. However, as each laser emits independently, the resulting beam is not focusable to a small spot also in this case. To ensure single mode lasing in large aperture devices complex approaches are used. For example, applying of external resonators to semiconductor disc lasers gain significant interest. However, the need in a complex optical system makes the device bulky and expensive.

Single-mode VCSEL was disclosed in the parent patent application Ser. No. 13/771,875 and is illustrated in FIG. 1A. FIG. 1A shows a schematic cross-section of a prior art VCSEL wherein the current flow is controlled by an oxide-confined aperture. The VCSEL structure (100) contains a resonant cavity (103) sandwiched between a bottom distributed Bragg reflector (DBR) (102) and a top DBR (106). The structure is grown epitaxially on a substrate (101). The active medium (105) is introduced in the resonance cavity (103).

Both bottom DBR (102) and top DBR (106) are formed of alternating layers having a low and a high refractive indices. Both DBRs (102) and (106) and the resonant cavity (103) are formed of materials lattice-matched or nearly lattice-matched to the substrate (101). Further these materials should be transparent to the emitted light.

Active medium (105) can be formed of a double heterostructure, quantum wells, quantum wires, quantum dots of their various combinations. Insertions forming the active medium can be lattice-mismatched to the substrate as long as they are thin and do not create structural defects.

Typically the bottom DBR (102) are n-doped, the resonant cavity (103) is undoped, and the top DBR (106) is p-doped. The substrate (101) is either n-doped, or is semi-insulating and contains additionally an n-doped buffer layer on top, on which the n-contact is mounted. The p-n junction is formed between the bottom DBR (102) and the top DBR (106). The bottom, or n-contact (111) is mounted on the n-doped substrate or on an n-doped buffer layer grown on top of a semi-insulating substrate (101), and the top, or p-contact (112) is mounted on top of the p-doped top DBR (106). Once the forward bias (113) is applied to the p-n junction, the active medium generates optical gain and emits light. The resonant cavity (103) determines the wavelength of the emitted light provided the cavity resonance wavelength is within the gain spectrum of the active medium. The bottom DBR (102) and the top DBR (106) provide feedback to the generated light. For a device configured to emit light through the top DBR transparency of the top DBR is higher than the transparency of the bottom DBR. Once gain overcome losses lasing occurs, and the emitted light comes out (135) through the top DBR (106).

To minimize optical losses it is important to avoid generation of light in the active medium beneath the top contact. To prevent such effect and determine the path of the electric current through the active medium (105), oxide-confined aperture is introduced. One layer or several layers of $Ga_{1-x}Al_xAs$ with a high Aluminum composition (preferably higher than 95%) is selectively oxidized forming an amorphous oxide $Ga_{1-x}Al_xO_y$ (145). The oxide layers are insulating and thus they determine the path for the electric current such that the current does not flow through the active medium beneath the top contact. Further, the oxide layers reduce the capacitance of the device which is of key importance for high speed VCSELs. The oxide layers (145) formed within the top DBR (106) mark the non-oxidized core region, or aperture region (150), and an oxidized periphery region (160). Laser light is coming out (135) from the core region (or aperture region) (150).

In the co-pending patent application U.S. Ser. No. 13/771,875 and U.S. Ser. No. 15/040,965 it is shown that many of optical properties of a structure can be considered in a one-dimensional approximation, once a structure is mimicked by a planar multilayer structure infinitely extended in the lateral plane. It is further shown in U.S. Ser. No. 13/771,875 and U.S. Ser. No. 15/040,965 that the optical modes of such a planar multilayer structure can be represented in a form of dispersion curves, $$\lambda^{(i)} = \lambda^{(i)}(\vartheta), \quad (1)$$

where $\vartheta$ is the mode angle defined with respect to a chosen reference layer. The longitudinal VCSEL mode is then represented by the highest-order mode of the planar multilayer structure, say, the mode of the order $N_{max}$. The modes of the lower order, $N<N_{max}$ are then tilted modes of the structure.

A one skilled in the art will agree that the wavelength of the fundamental mode of a VCSEL having finite dimensions in the lateral plane, the computation of which requires solving a two-dimensional problem for a cylindrically-symmetric device or a three-dimensional problem in the general case, will tend to its asymptotic value $\lambda^{(N_{max})}(0)$ upon increase of the lateral dimensions of the device.

FIG. 1B shows the dispersion curves of the VCSEL modes in the planar multilayer structures mimicking the VCSEL (100). The left panel of FIG. 1B depicts the dispersion curve of the VCSEL mode in the non-oxidized core (150), and the right panel demonstrates the dispersion curve in the oxidized periphery (160).

As the oxide layers have the refractive index ~1.5-1.6 which is approximately twice lower than that of the semiconductor materials, the oxidation shifts the dispersion curve towards shorter wavelengths. However, it was especially emphasized in U.S. Ser. No. 13/771,875 and U.S. Ser. No. 15/040,965 that longitudinal VCSEL optical mode of the core is formed in the spectral region, in which a plurality of tilted optical modes of the periphery exist. This could give a possibility of a leakage of the VCSEL optical mode from the non-oxidized core region to the oxidized periphery region. The strength of the leakage can be quantified by an overlap integral between vertical profiles of the optical fields of the two modes in two neighboring regions.

A one skilled in the art will appreciate that the optical modes in a planar multilayer structure similar to that of FIG. 1A are eigenmodes of the one-dimensional wave equation. This equation for transverse electric (TE) modes has the form:

$$-\frac{d^2}{dz^2} E_y(z) - \left(\frac{2\pi}{\lambda}\right)^2 n^2(z) E_y(z) = -\left(\frac{2\pi}{\lambda}\right)^2 n_{eff}^2 E_y(z). \quad (2)$$

Here z is the vertical direction perpendicular to the layers, $n_{eff}$ is the effective refractive index of the optical mode related to the mode angle as follows:

$$n_{eff} = n_{reference\ layer} \sin \vartheta. \quad (3)$$

The two different eigenmodes of Eq. (2) calculated for the same refractive index profile obey the following orthogonality criterion:

$$\int (E_y^{(j)})^*(z)(E_y^{(i)})(z)dz=0, \text{ if } j \neq i \quad (4)$$

Once the optical modes calculated for two different optical profiles are considered, the integral $$\int (E_y^{(j)(periphery)})^*(z)(E_y^{(i)(core)})(z)dz \neq 0 \quad (5)$$

does not vanish and can be regarded as a measure of the orthogonality breakdown.

A following note should be given. The overlap integral (5) gives just a semi-quantitative measure of the lateral leakage of the optical modes from the core to the periphery. Exact evaluation of the leakage losses and the corresponding modal lifetime requires solving a two-dimensional problem (for cylindrically symmetric structures) or a three-dimensional problem for a general shape structure.

To quantify the overlap integrals, it is useful to normalize (5). The normalized overlap integral of Eq. (5) equals:

$$W_{ji}^{(1)} = \frac{\left|\int (E_y^{(j)(periphery)})^*(z)(E_y^{(i)(core)})(z)dz\right|^2}{\int |E_y^{(j)(periphery)}(z'')|^2 dz'' \times \int |E_y^{(i)(core)}(z')|^2 (z')dz'}. \quad (6)$$

Similar consideration can be performed for transverse magnetic (TM) modes. This equation for TM modes has the form:

$$-\frac{d}{dz}\left[\frac{1}{n^2(z)}\frac{d}{dz}H_y(z)\right] - \left(\frac{2\pi}{\lambda}\right)^2 H_y(z) = -\left(\frac{2\pi}{\lambda}\right)^2 \frac{1}{n^2(z)} n_{eff}^2 H_y(z). \quad (7)$$

The two different eigenmodes of Eq. (7) calculated for the same refractive index profile obey the following orthogonality criterion:

$$\int (H_y^{(j)})^* n^{-2}(z)(H_y^{(i)})(z)dz=0, \text{ if } j \neq i \quad (8)$$

Once the optical modes calculated for two different optical profiles are considered, the integral $$\int (H_y^{(j)(periphery)})^*(z)[n^{(periphery)}(z)]^{-1}[n^{(core)}(z)]^{-1} (H_y^{(i)(core)})(z)dz \neq 0 \quad (9)$$

does not vanish and can be regarded as a measure of the orthogonality breakdown. Normalized overlap integral of the TM modes has the form $$W_{ji}^{(1)} = \frac{\left|\int (H_y^{(j)(periphery)})^*(z)[n^{(periphery)}(z)]^{-1}[n^{(core)}(z)]^{-1}(H_y^{(i)(core)})(z)dz\right|^2}{\int |H_y^{(j)(periphery)}(z'')|^2 [n^{(periphery)}(z'')]^{-2} dz'' \times \int |H_y^{(i)(core)}(z')|^2 [n^{(core)}(z')]^{-2} dz'}.$$ (10)

The concept of the engineering of oxide confined apertures enhancing lateral leakage of high-order transverse modes disclosed in the co-pending patent application U.S. Ser. No. 13/771,875 was confirmed by the exact two-dimensional modeling in a cylindrically symmetric VCSEL (V. Shchukin, N. N. Ledentsov, J. Kropp, G. Steinle, N. Ledentsov, Jr., S. Burger, and F. Schmidt, "Single-Mode Vertical Cavity Surface Emitting Laser via Oxide-Aperture-Engineering of Leakage of High-Order Transverse Modes", IEEE Journal of Quantum Electronics, volume 50, issue 12, pp. 990-995, December 2014, wherein this publication is hereby incorporated herein by reference). Further, experimental studies of such VCSEL reported in that publications confirmed single mode lasing of the 850 nm VCSEL up to the aperture diameter of ~5 μm.

However, the leakage of the VCSEL optical mode to the oxidized periphery occurs via the doped semiconductor layers, typically, via p-doped semiconductor layers. Once the leakage component of the optical field is not considered as a lost field but as a means of coupling of VCSELs in a coherent array, the losses due to the free carrier absorption is not desirable. Then, the leakage to non-absorbing dielectric layers or to the air is preferred. Further, in order to enable integration of a VCSEL into an integrated optical surface, a possibility of coupling of the radiated VCSEL mode to a mode of a planar optical waveguide is needed. Therefore, there is a need in the art to extend the leakage approach to an appropriate configuration of a device.

SUMMARY OF THE INVENTION

An optoelectronic device employs a surface-trapped TM-polarized optical mode existing at a boundary between a distributed Bragg reflector and a homogeneous medium, dielectric or air. The device contains a resonant optical cavity surrounded by two DBRs, and an additional DBR section on top supporting the surface-trapped mode. Selective chemical transformation, like selective oxidation, etching or alloy composition intermixing form a central core and a periphery having different vertical profiles of the refractive index. Therefore, the longitudinal VCSEL mode in the core is non-orthogonal to the surface-trapped mode in the periphery, and the two modes can be transformed into each other. Such transformation allows fabrication of a number of optoelectronic devices and systems like a single transverse mode VCSEL, an integrated optical circuit operating as an optical amplifier, an integrated optical circuit combining a VCSEL and a resonant cavity photodetector, etc.

BRIEF DESCRIPTION OF THE DRAWINGS

FIG. 1A. Schematic cross-section of a vertical cavity surface-emitting laser (VCSEL) with an oxide-confined aperture.

FIG. 1B. Schematic dispersion curves of the VCSEL optical mode in the core and of a tilted optical mode of the periphery of the planar multilayer structure mimicking the core and the periphery of the VCSEL of FIG. 1A, respectively. A possibility of leakage of the optical modes from the core to the periphery is illustrated.

FIG. 6A. Refractive index profile in the vertical direction in the non-oxidized core region of a vertical-cavity surface-emitting laser (VCSEL) reproducing the profile of FIG. 5A.

FIG. 6B. Magnetic field strength profile of the longitudinal optical mode of the VCSEL of FIG. 5A in the non-oxidized core region reproducing the profile of FIG. 5B.

FIG. 6C. Magnetic field strength profile of the surface-trapped mode of the VCSEL of FIG. 5A in the oxidized periphery region.

FIG. 6D. Refractive index profile in the vertical direction in the oxidized periphery region of a vertical-cavity surface-emitting laser (VCSEL) reproducing the profile of FIG. 5A.

DETAILED DESCRIPTION OF THE INVENTION

The present patent application employs the properties of a surface optical wave which can be formed at a boundary between a distributed Bragg reflector (DBR) and the air or at a boundary between a DBR and a thick dielectric layer. Such wave was disclosed in the recent publication by V. A. Shchukin, N. N. Ledentsov, V. P. Kalosha, N. Ledentsov Jr., M. Agustin, J.-R. Kropp, M. V. Maximov, F. I. Zubov, Yu. M. Shernyakov, A. S. Payusov, N. Yu. Gordeev, M. M. Kulagina, A. E. Zhukov, and A. Yu. Egorov, "Virtual cavity in distributed Bragg reflectors", Optics Express, volume 26, issue 19, of Sep. 17, 2018, wherein this publication is hereby incorporated herein by reference, referred below to as Shchukin '18.

Figure 2:
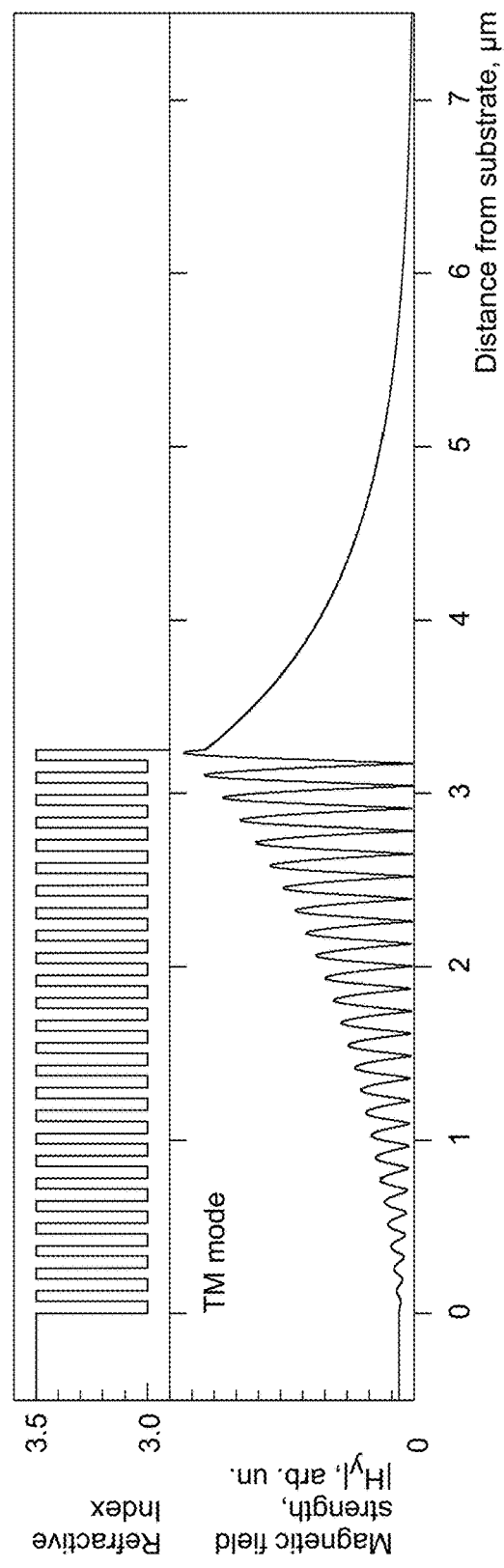
FIG. 2. Refractive index profile of a semiconductor distributed Bragg reflector (DBR) and the magnetic field strength profile of a TM optical mode, localized on the surface of the DBR.

FIG. 2 illustrates a DBR formed of 25 periods of layers with alternating refractive indices $n_1=3.5$ and $n_2=3.0$, which are typical for Ga(1-x)Al(x)As alloy with a low and a high Al composition, respectively. The thicknesses of the layers equal $d_1=\lambda_0/(4n_1)$ and $d_2=\lambda_0/(4n_2)$, respectively. FIG. 2A, lower panel depicts the magnetic field strength profile of the surface-trapped TM optical mode. The mode is localized at the surface of the DBR, modeling performed for the particular value of $\lambda_0=850$ nm. One should emphasize that, as shown in Shchukin '18, the TM mode localized at the surface does not exist at the wavelength of light $\lambda_0$, but only in a certain interval of shorter wavelengths, approximately at $0.91\lambda_0<\lambda<0.95\lambda_0$. Further, only TM mode, and no TE mode can be localized at the surface.

The present application discloses implementing a localized surface optical mode on top of a VCSEL operating at a certain wavelength $\lambda_0$. Then, in order to localize a surface mode, the reflectivity stopband of the top DBR should have the reflectivity maximum at a wavelength larger than $\lambda_0$, typically in the interval from $1.05\lambda_0$ to $1.1\lambda_0$, for DBR with alternating layers with refractive indices 3.5 and 3.0. On the other hand, in order to reach a reasonable photon lifetime in the VCSEL cavity, the DBR should preferably have the reflectivity maximum at $\lambda_0$. Thus, a certain combined DBR is needed.

Figure 3A:
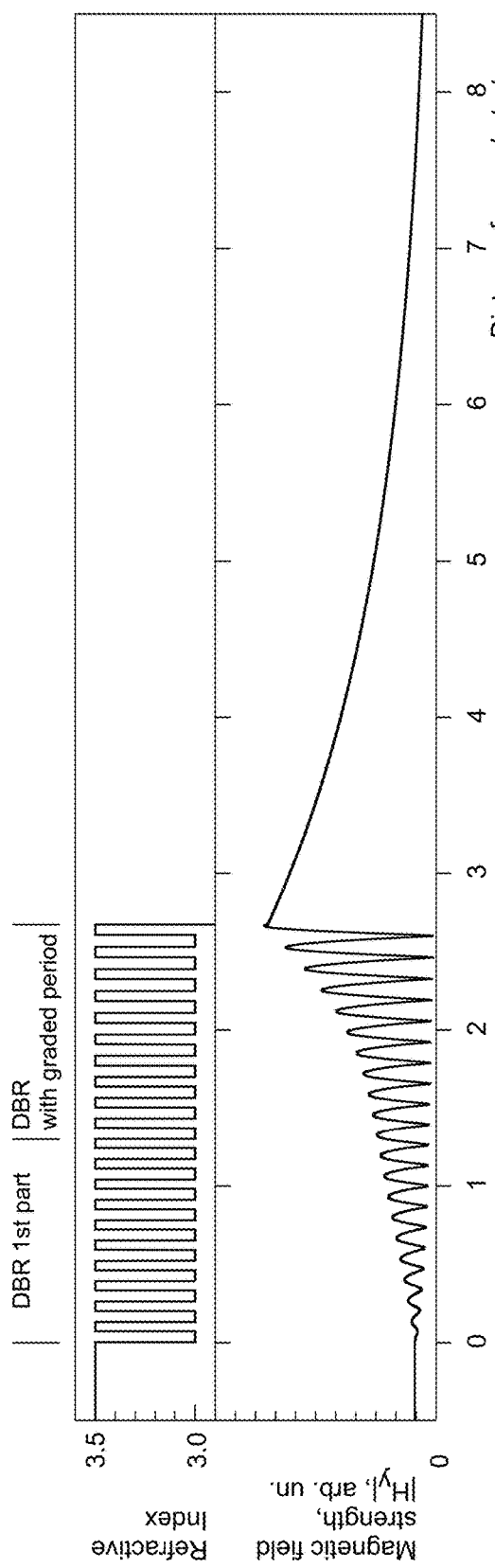
FIG. 3A. Refractive index profile of a composite semiconductor DBR, containing a section with a gradually variable DBR period and the magnetic field strength profile of a TM optical mode localized at the surface of the structure.

FIG. 3A illustrates an approach to a combined DBR. The bottom section has a reflectivity stopband maximum at $\lambda_0$, whereas the top section of the DBR contains a DBR with gradually changing period, in each next period, the thickness of both layers increase by 2%. The bottom panel of FIG. 3A depicts the magnetic field strength profile of the TM mode localized at the surface of this DBR.

Figure 3B:
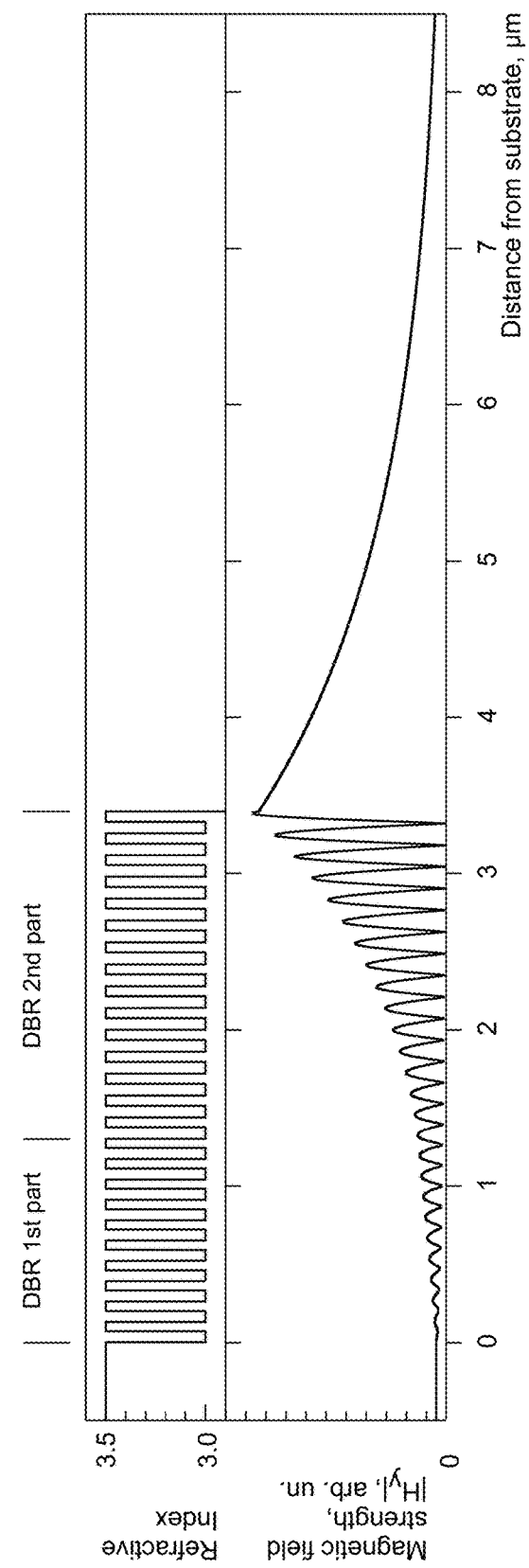
FIG. 3B. Refractive index profile of a composite semiconductor DBR, containing two sections with different DBR periods and the magnetic field profile of the TM optical mode localized at the surface of the structure.

FIG. 3B suggests a different approach to a combined DBR. The first part of the DBR has the reflectivity maximum at $\lambda_0$, whereas the second, topmost part of the DBR, has the reflectivity maximum at $1.1\lambda_0$. The lower panel of FIG. 3B displays the magnetic strength profile of the TM mode, localized at the surface of this structure.

Figure 4A:
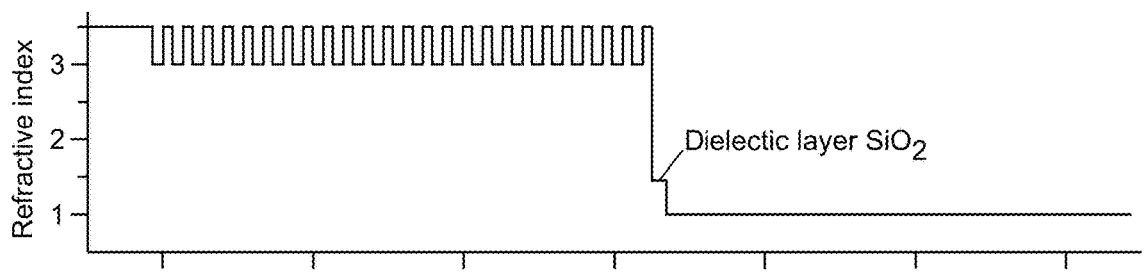
FIG. 4A. Refractive index profile of a semiconductor DBR with an additional dielectric layer on top.
Figure 4B:
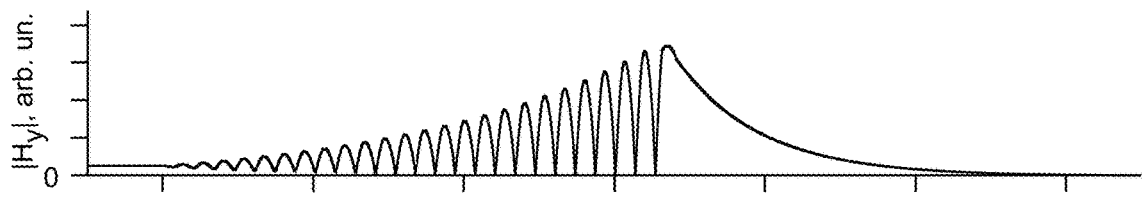
FIG. 4B. Magnetic field strength profile of the TM optical mode localized at the surface of the structure of FIG. 4A.

Additional layer on top of the DBR can further extend a possibility of the formation of a surface mode. FIG. 4A displays the DBR, the stopband reflectivity maximum of which is at $1.02\lambda_0$, i. e. is only by 2% at a longer wavelength than the targeted wavelength $\lambda_0$. No surface mode can be localized at the surface of such DBR. However, additional layer of a dielectric (for definiteness, amorphous $SiO_2$ is considered with the refractive index 1.45) enables localized TM mode as shown in FIG. 4B.

Figure 4C:
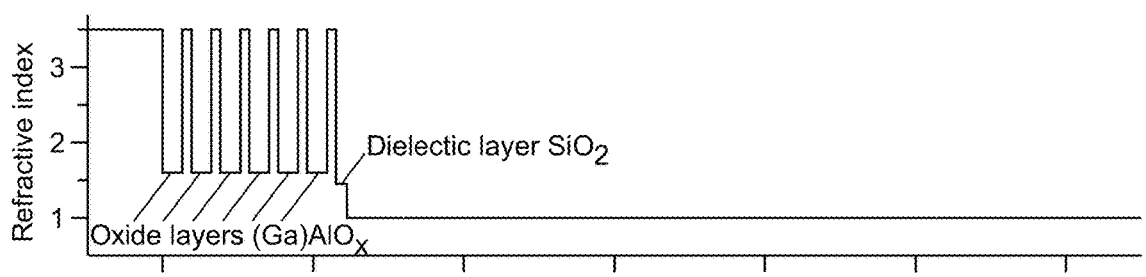
FIG. 4C. Refractive index profile of a high-contrast GaAlAs/(Ga)AlO$_x$ DBR with an additional SiO$_2$ dielectric layer on top.
Figure 4D:
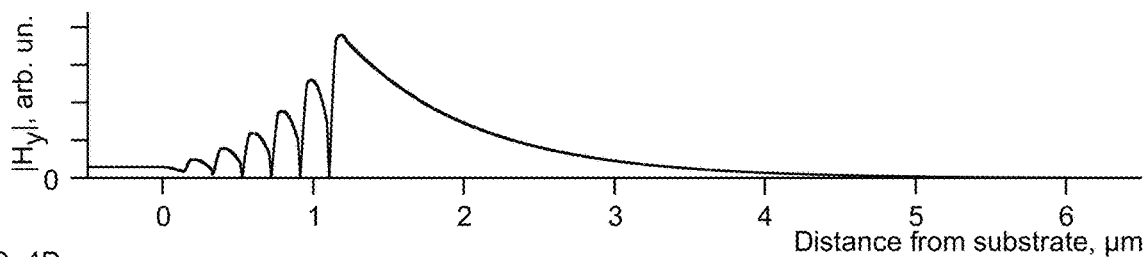
FIG. 4D. Magnetic field strength profile of the TM optical mode localized at the surface of the structure of FIG. 4C.

High contrast DBR extends possibilities for the formation of a localized surface optical mode. Such high-contrast DBR can be formed by the oxidation of Ga(1-x)Al(x)As layers with a high Al composition and formation of amorphous oxide layers Ga(1-x)Al(x)O(y). FIG. 4C shows a high-contrast DBR, the maximum reflectivity of which is exactly at the wavelength $\lambda_0$. Then, addition of a single layer of SiO2 enables a surface localized TM mode as displayed in FIG. 4D.

A one skilled in the art will appreciate that other types of the DBR also are capable to localize the optical mode at the boundary. These can be semiconductor or dielectric DBRs, periodic DBRs, DBRs combined of several periodic structures, DBRs combined of a periodic and an aperiodic parts, or a completely aperiodic DBR.

Further, a surface-trapped mode can also be formed not only at a boundary between a DBR and air, but also at boundary between a DBR and another homogeneous medium, i.e. a bulk dielectric, as long as the refractive index of the topmost layer of the DBR is larger than the refractive index of the homogeneous medium. All these combinations can be considered and modeled in a similar way.

Figure 5A:
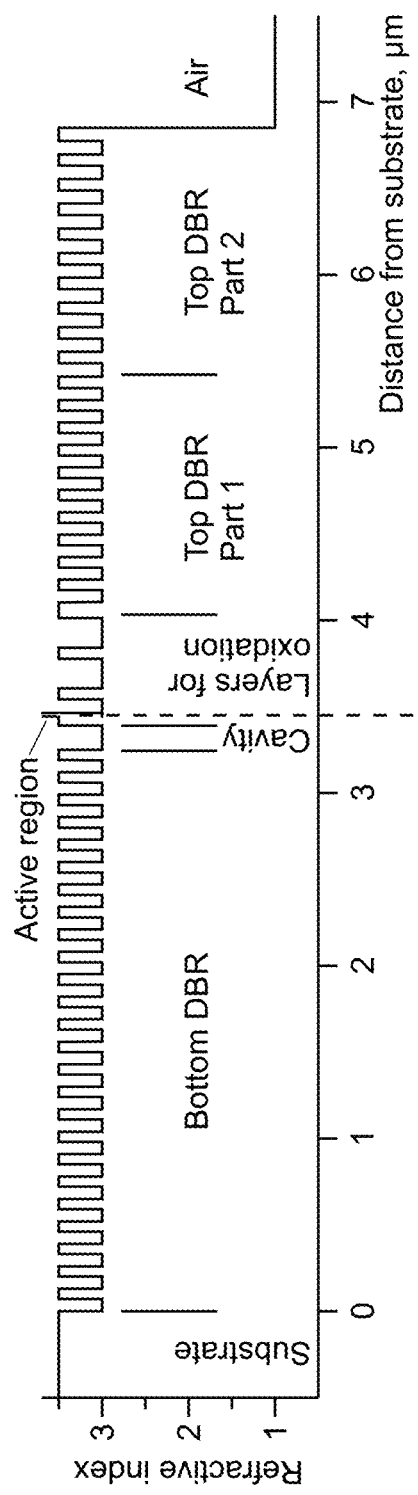
FIG. 5A. Refractive index profile in the vertical direction of a vertical-cavity surface-emitting laser (VCSEL) with a composite top DBR of FIG. 3B.
Figure 5B:
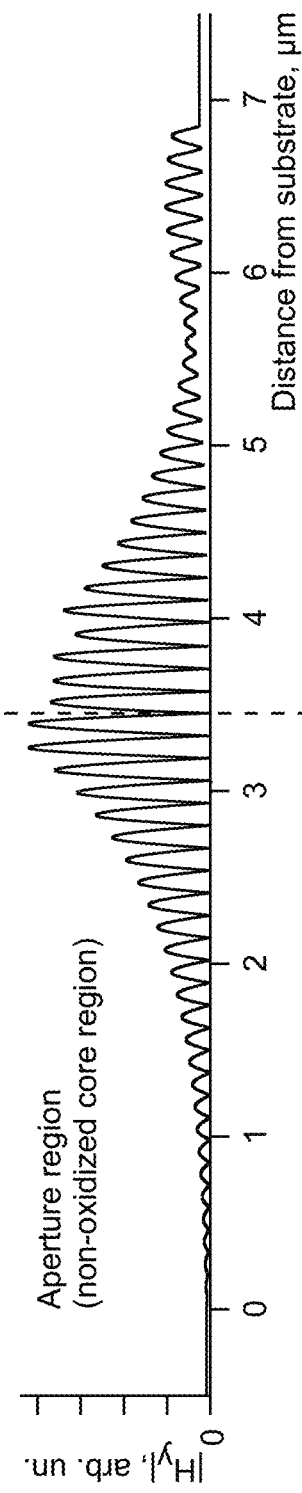
FIG. 5B. Magnetic field strength profile of the longitudinal optical mode of the VCSEL of FIG. 5A.
Figure 5C:
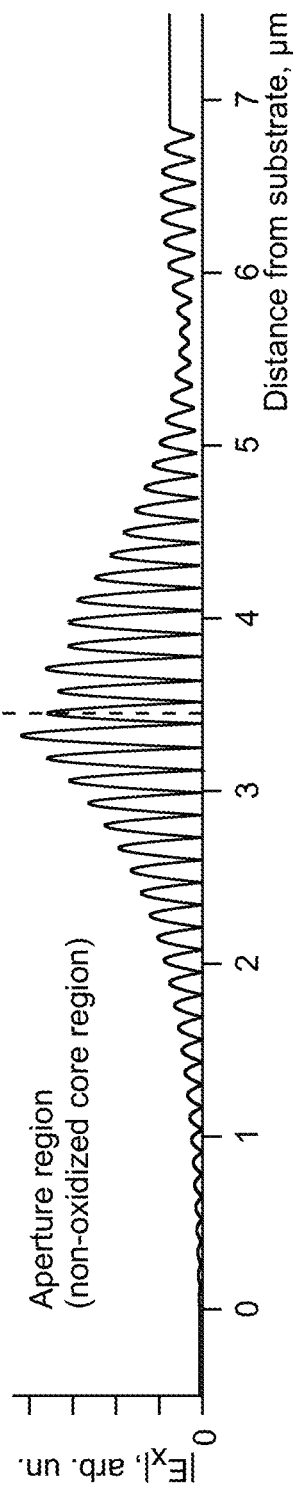
FIG. 5C. Electric field strength profile of the longitudinal optical mode of the VCSEL of FIG. 5A.

FIG. 5A illustrates a possible implementation of a composite DBR (as in FIG. 3B) in a VCSEL. FIG. 5B displays the magnetic field strength profile, and FIG. 5C depicts the electric field profile in the longitudinal VCSEL mode. It should be noted, that the electric and magnetic field profiles are shifted, and local maxima of the electric field occurs in the nodes of the magnetic field. The active medium is placed in a local maximum of the electric field strength, whereas the magnetic field at the active medium vanishes.

The second part of the top DBR having the reflectivity maximum at a wavelength longer than the targeted lasing wavelength forms an effective cavity for the longitudinal VCSEL mode resulting in some enhancement of the intensity of the electric and magnetic fields in this section.

FIGS. 6A through 6D compare the refractive index and magnetic field profiles in the non-oxidized core region and in the oxidized periphery regions of the device. FIG. 6A reproduces the refractive index profile in the non-oxidized core region, same as in FIG. 5A. FIG. 6D displays the refractive index profile in the oxidized periphery region, wherein two oxide layers are formed.

FIG. 6B shows the magnetic strength profile in the non-oxidized core region, reproducing the profile of FIG. 5B. The magnetic field strength profile of the surface-trapped mode in the oxidized periphery region is plotted in FIG. 6C. It should be noted that the plot of FIG. 6C is inverted. The absolute values of the magnetic field strength that are the positive numbers are displayed in the downward vertical direction. This is done for convenience. In such a way it is more convenient to compare the nodes of the two magnetic field profiles of FIGS. 6B and 6C. To make such a comparison, each node (or each local minimum) of the optical field profile of FIG. 6C is connected by a dashed line with the closest node of the optical field profile of FIG. 6B.

It follows from FIG. 6C that the two oxide layers significantly suppress the extension of the field into the bottom DBR. In the first part of the top DBR the phase shift between the magnetic field profiles in the core and in the periphery regions is such that the corresponding contribution to the overlap integral of Eq. 10 nearly vanishes. In the second part of the top DBR each node or the local minimum of the magnetic field profile of FIG. 6B is connected by a dashed line with the closest node of the magnetic field profile of FIG. 6C. As the nodes of the two profiles nearly match, a significant contribution to the overlap integral comes just from the second part of the top DBR.

A following note should be given. In a real structure of an oxide-confined VCSEL, a plurality of transverse optical modes associated with the same longitudinal optical modes are formed and localized by an oxide-confined aperture. In a one-dimensional approximation, various transverse modes can be mimicked by tilted modes, which dispersion relation is depicted in the left panel of FIG. 1B. Once the mode angle with respect to the vertical direction is small, the tilt has only a minor impact on the profile of the longitudinal mode in the vertical direction. Then the consideration of FIGS. 5A through 6D remains valid and can be applied to the modes tilted at angles, at least up to 5 degrees with respect to the vertical axis, whereas the tilt angle is defined in some reference semiconductor layer.

FIGS. 5A through 6D refer to an oxide-confined VCSEL. In another embodiment of the present invention, selective chemical etching of one or several layers can be carried out instead of the oxidation. Etching will result in the formation of one or several air gaps. Then, the structure will also contain two domains, the core, in which no chemical transformation of the material has occurred, and the periphery, where an air gap or air gaps are formed. The surface-trapped mode in the periphery and the vertical VCSEL mode in the core will be non-orthogonal.

In yet another embodiment of the present invention selective oxidation of one or several layers is followed by the oxide removal, which results in the formation of an air gap or air gaps.

In a further embodiment of the present invention, alloy composition intermixing is carried out in a part of the structure.

In any of these embodiment, selective chemical transformation results in the formation of two domains, a core, in which no transformation has taken place, and a periphery. These two domains have different vertical profiles of the refractive index. Therefore, the vertical mode of the VCSEL in the core region and the surface-trapped mode in the periphery region are non-orthogonal. Depending on the particular technology, i. e. on the particular type of the selective chemical transformation applied, the structure can be optimized in order to maximize the overlap integral between these two modes.

It is preferred to achieve the overlap integral larger than 10%.

It is further preferred to configure an optimize device in such a way that the overlap integral is larger than 20%.

Figure 13:
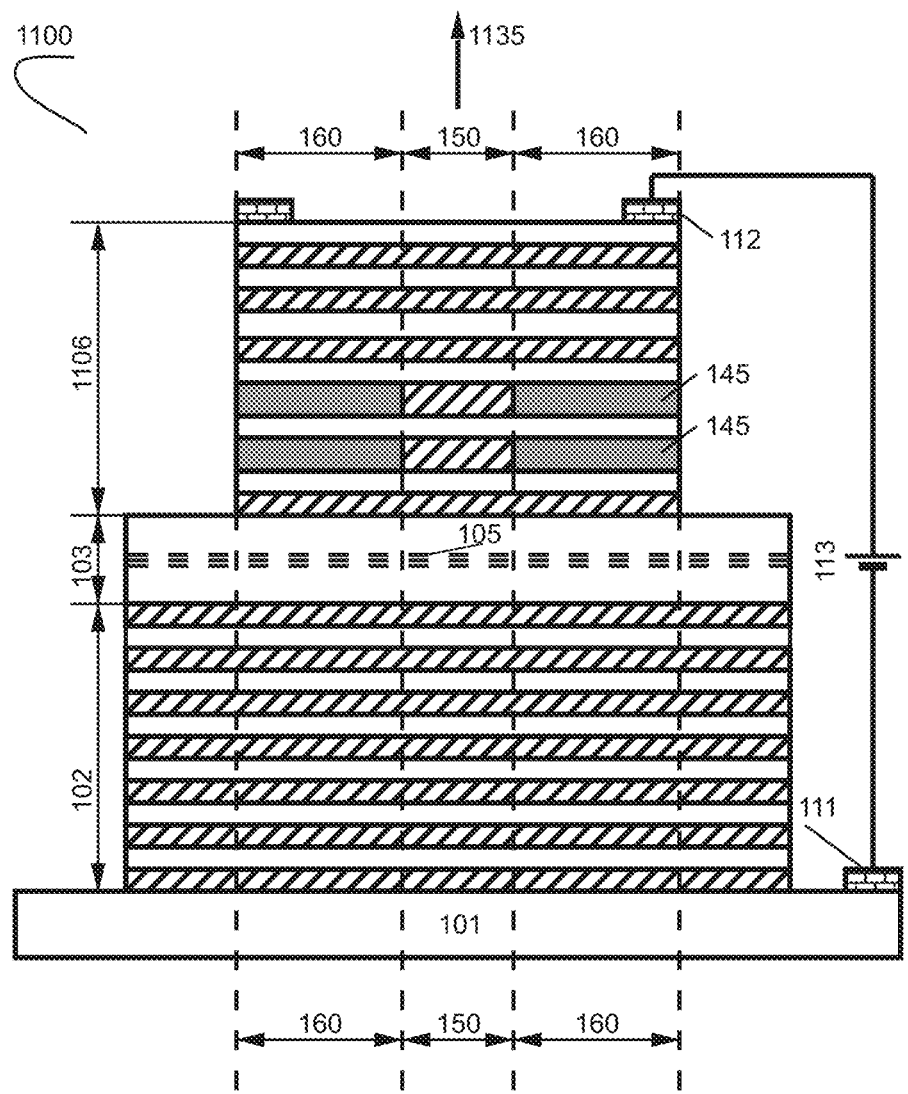
FIG. 13 shows schematically a VCSEL of an embodiment of the present invention emitting laser light in a single transverse mode.

FIG. 13 shows a VCSEL (1100) according to an embodiment of the present invention, wherein the top DBR (1106) is a combined DBR corresponding to one of the variations of FIGS. 3A, 3B, 4A, and 4C. High order transverse optical modes associated with the vertical operational mode of the device have higher lateral leakage losses to the periphery than the fundamental transverse optical mode, thus supporting single transverse mode operation of the device, i. e. emission of a single mode laser light (1135).

Figure 7:
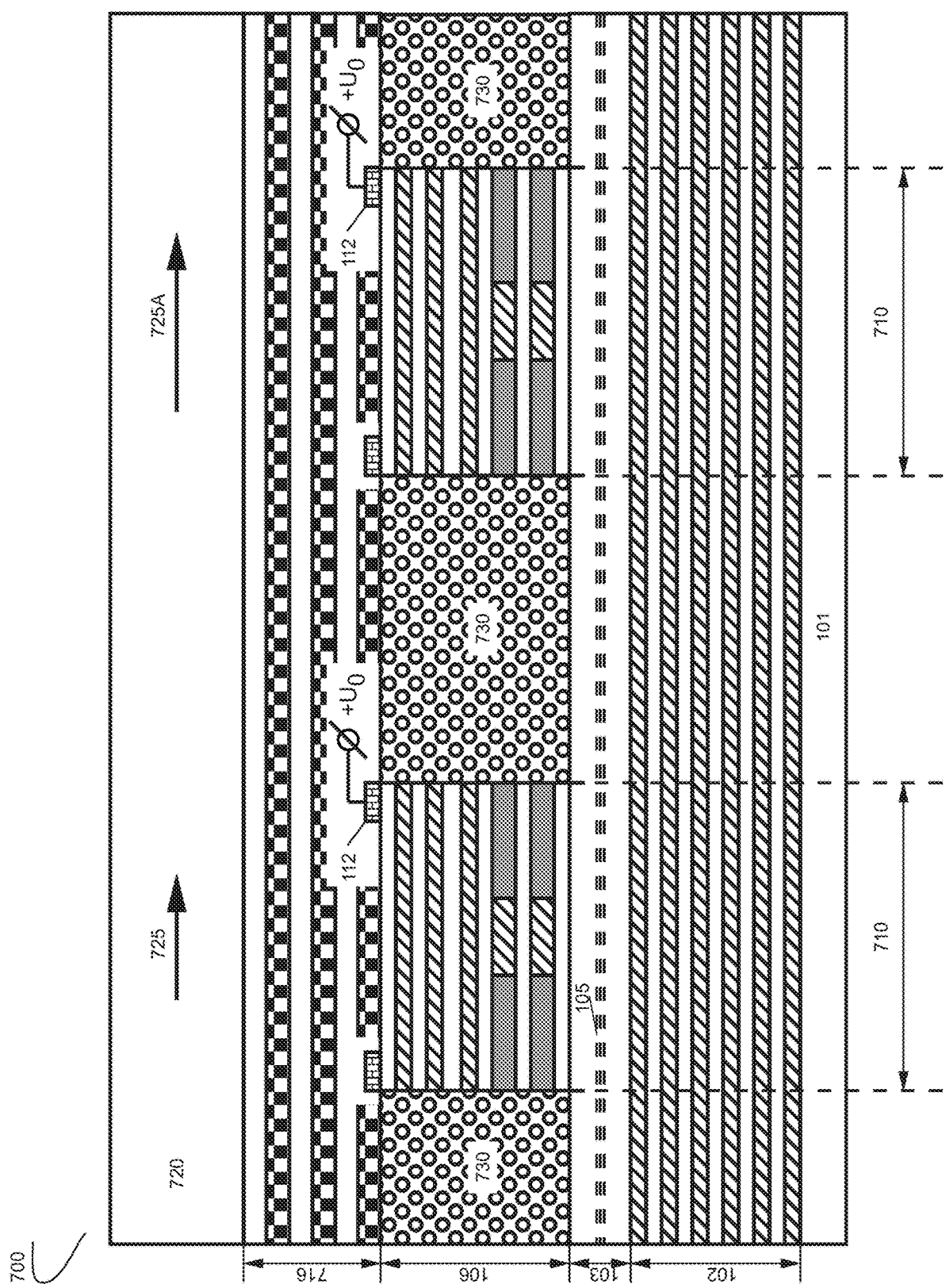
FIG. 7. A part of an optical integrated circuit, according to an embodiment of the present invention, whereas the optical coupling of the VCSELs via the localized surface mode to a planar waveguide provides amplification of the optical wave propagating along the waveguide.

FIG. 7 illustrates a part of an optical integrated circuit (700), according to another embodiment of the present invention. Two VCSELs (710) are formed on a single epitaxial wafer having the common bottom DBR (102) and the common resonance cavity (103). Top DBRs (106) of two VCSELs are formed in different mesas. The space between mesas is filled by a dielectric (730) for planarization of the device. Preferably BCB is used for planarization of the VCSEL structure. Each of the VCSELs operates under a direct bias $U_0$. Above a top DBR (106) formed of semiconductor materials, a dielectric DBR (716) is deposited. A planar dielectric waveguide (720) is attached to the planarized VCSEL structure, above the dielectric DBR (716). The dielectric DBR (716) and the dielectric waveguide (720) are configured such, that a surface-trapped mode is formed at the boundary between the dielectric DBR (716) and the dielectric waveguide (720). The mode exhibits an evanescent decay to the dielectric waveguide (720) ad an oscillatory decay to the dielectric DBR (716). Due to the coupling between the VCSEL mode and the surface trapped mode, the optical wave propagating along the planar waveguide is being amplified, as is illustrated by an arrow (725A) which is shown longer than the arrow (725), demonstrating the amplification of light.

A note should be given. The wavelength 850 nm used in the plots of FIGS. 2 through 6 is used only as example. Since integrated optical circuits of silicon photonics operate preferably at longer wavelengths, where silicon is transparent, the devices disclosed herein are not limited to the wavelength shown in FIGS. 2 through 6.

Figure 8:
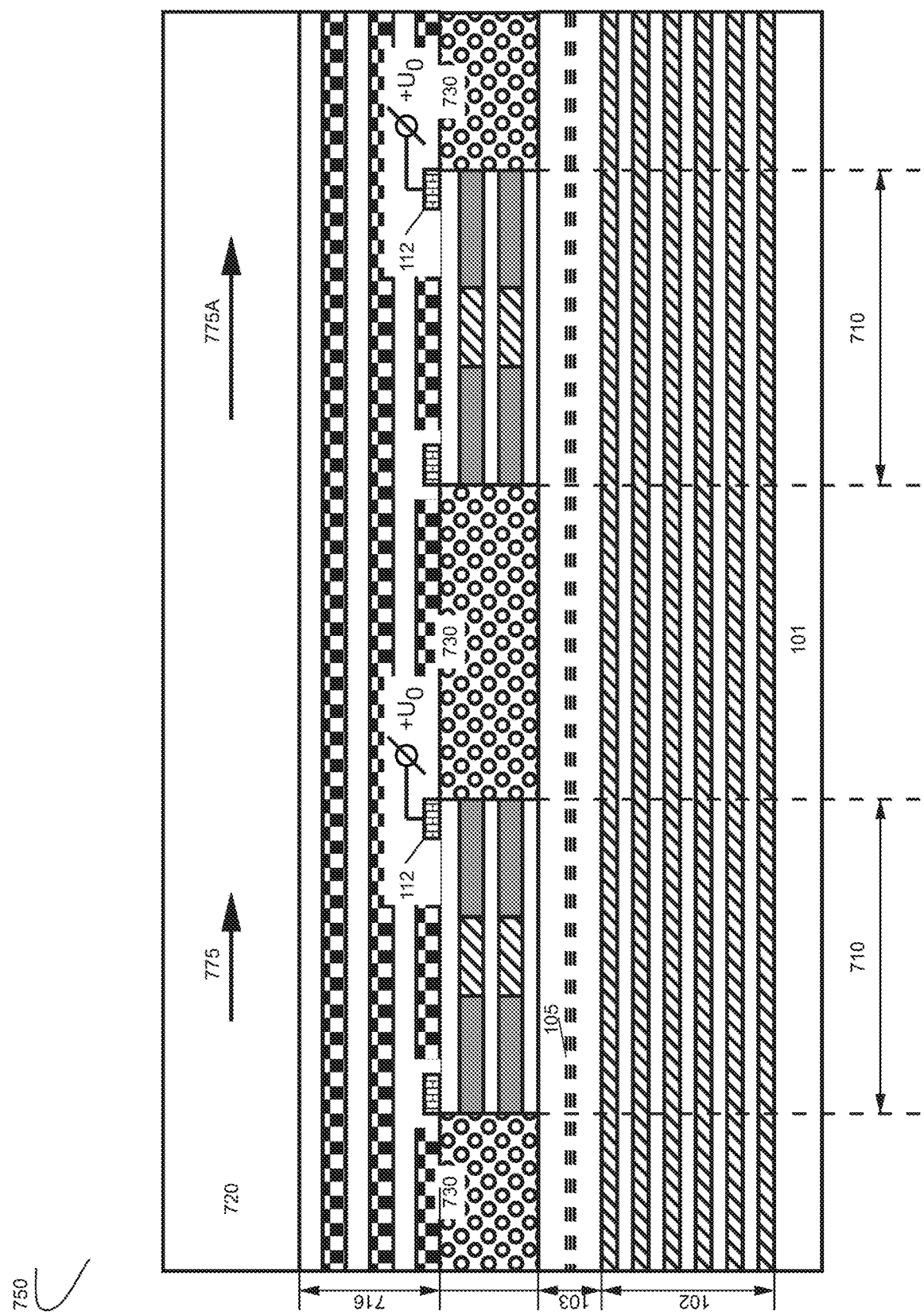
FIG. 8. A part of an optical integrated circuit, according to another embodiment of the present invention, whereas the optical coupling of the VCSELs via the localized surface mode to a planar waveguide provides amplification of the optical wave propagating along the waveguide.

FIG. 8 illustrates a part of an optical integrated circuit (750), according to yet another embodiment of the present invention. The VCSELs do not include top semiconductor DBRs, and the dielectric DBR (716) is deposited immediately on top of the top selectively oxidized aperture layer. Similarly, the optical wave propagating along the planar waveguide is being amplified, as is illustrated by an arrow (775A) which is shown longer than the arrow (775), demonstrating the amplification of light.

Figure 9:
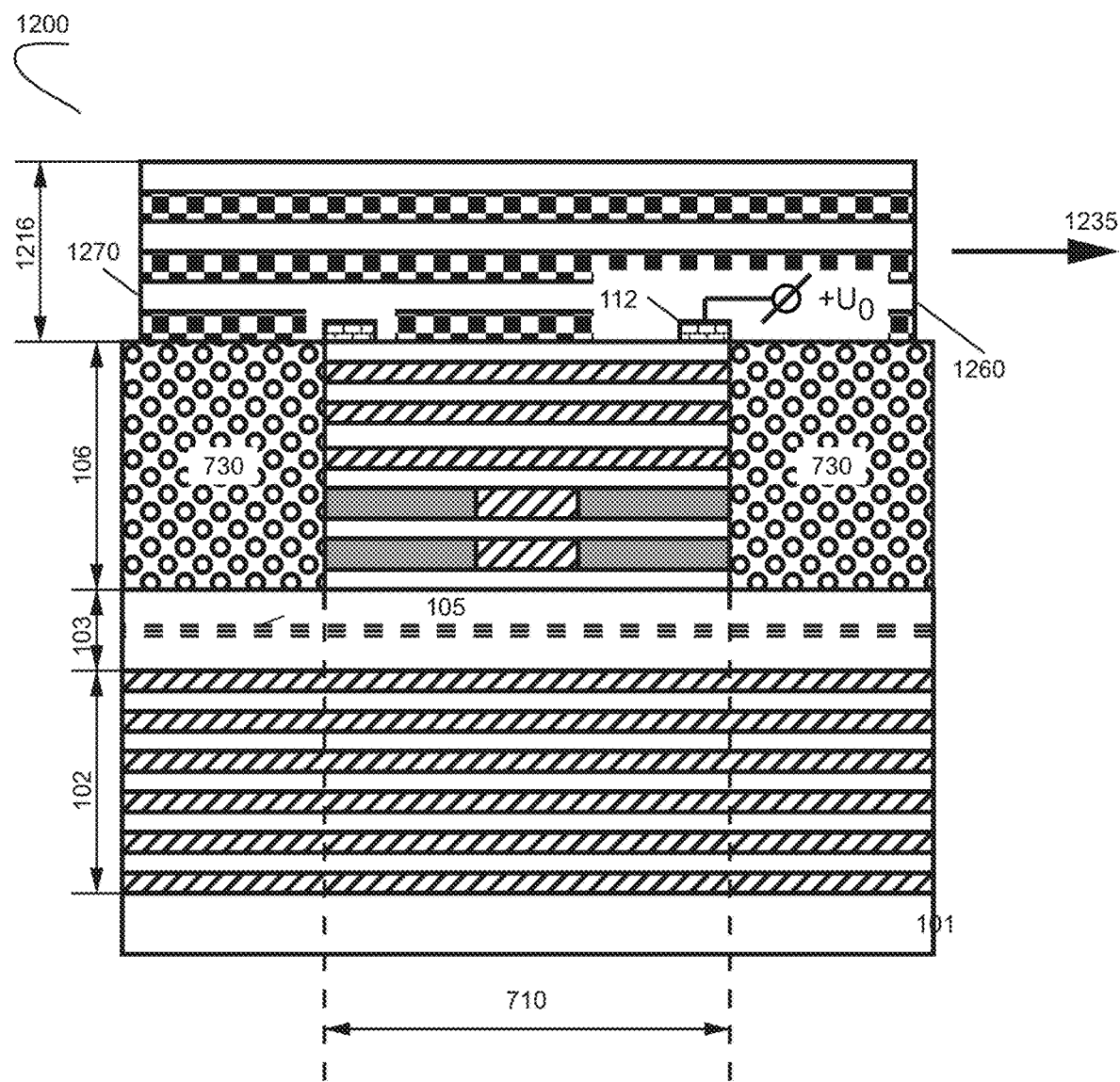
FIG. 9. An edge-emitting laser, according to yet another embodiment of the present invention.

FIG. 9 illustrates an edge-emitting laser (1200), according to a further embodiment of the present invention. Similarly to the embodiment of FIG. 7, a dielectric DBR (1216) is deposited on top of the semiconductor DBR (106). The dielectric DBR (1216) is configured such that a surface-trapped mode is localized at the top surface of the dielectric DBR (1216) and exhibits evanescent decay in the upward direction in the air. This mode can propagate in the lateral plane. The dielectric DBR (1216) is additionally bounded by two facets, a front facet (1260), and a rear facet (1270), which are parallel to each other and perpendicular to the lateral plane. The two facets provide the feedback for the surface-trapped optical mode travelling forth and back along the lateral plane, resulting in lasing (1235).

A one skilled in the art will appreciate, that an in-plane distributed Bragg reflector can be applied instead one facet or both facets.

Figure 10:
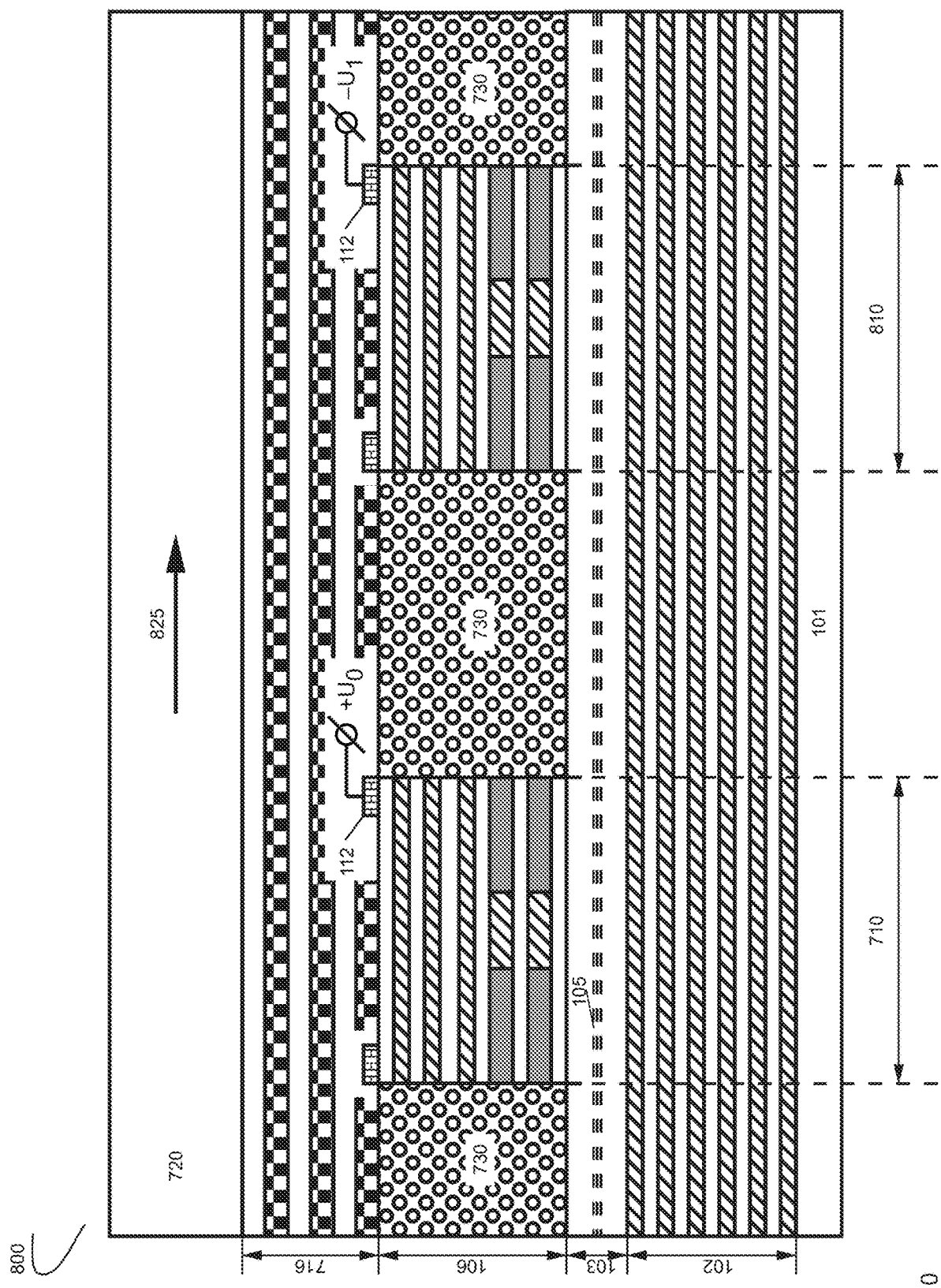
FIG. 10. Optical integrated circuit of another embodiment of the present invention, containing a VCSEL and a photodetector, both coupled via the localized surface mode to a planar optical waveguide.

FIG. 10 illustrates an optical integrated circuit (800), according to yet another embodiment of the present invention. VCSEL (710) operating under a direct bias $U_0$ and a resonant cavity photodetector (810) operating under a reverse bias $-U_1$ are attached to a planar waveguide (825). Laser light emitted by the VCSEL (710) is coupled, via the localized surface optical mode, to the waveguide (820), propagates (825) along the waveguide and, via the localized surface optical mode, is coupled to the resonant cavity photodetector (810), the integrated circuit (800) thus allowing monitoring of the VCSEL.

Figure 11:
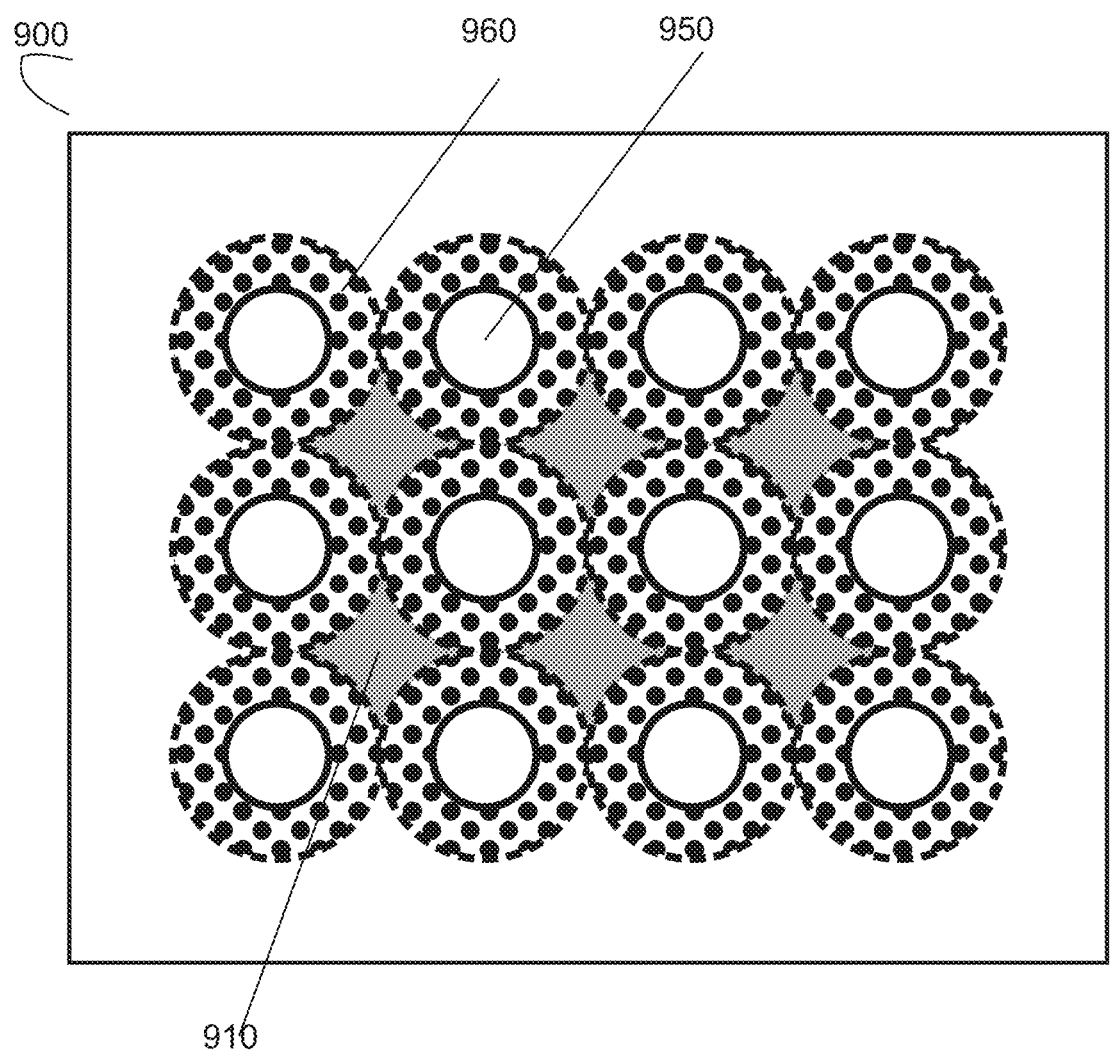
FIG. 11 shows schematically a plan view of phase-coupled array of VCSELs, wherein the coupling is realized via the leakage of the optical modes from the core regions into the surrounding periphery regions, according to another embodiment of the present invention.

FIG. 11 shows schematically a plan view of an array (900) of phase-coupled VCSELs, according to a further embodiment of the present invention. An array of holes (950) is formed on the surface. The selective chemical transformation process is carried out. As a result of the process chemically transformed regions (960) are formed around the holes. The width of the chemically transformed regions is preferably selected such that the chemically transformed regions formed around neighboring holes overlap or are close to overlap. The areas (910) between the intermixed regions are the areas, in which the current flow through the active medium is possible and in which no chemical transformation occurs. The contact is deposited onto these areas (910). The epitaxial structure is configured according to the present invention (FIGS. 5A, 6A, 6D). The optical modes excited beneath the contacts leak into the chemically transformed regions. Due to a sufficiently strong optical coupling between neighboring chemically transformed regions, a single coherent mode can be formed extending over the entire array of VCSELs. In a further embodiment of the present invention, a single coherent mode extends across the entire wafer.

Figure 12A:
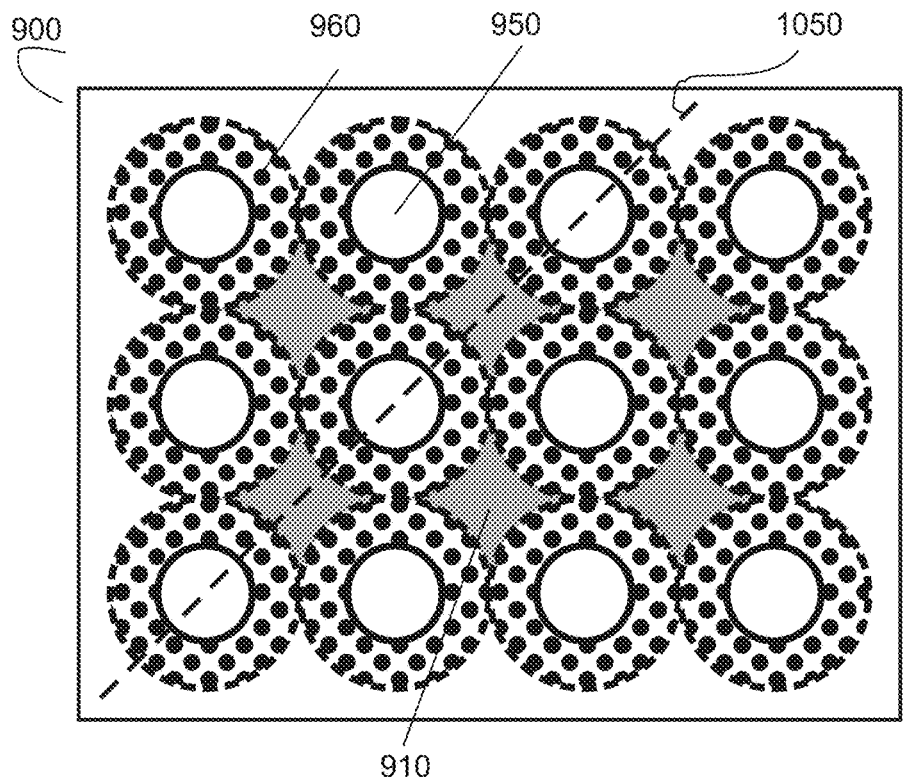
FIG. 12A shows schematically a plan view of phase-coupled array of VCSELs, wherein the coupling is realized via the leakage of the optical modes from the core regions into the surrounding periphery regions, similar to FIG. 11, and further denotes a plane for the vertical cross-section to be shown in FIG. 12B.
Figure 12B:
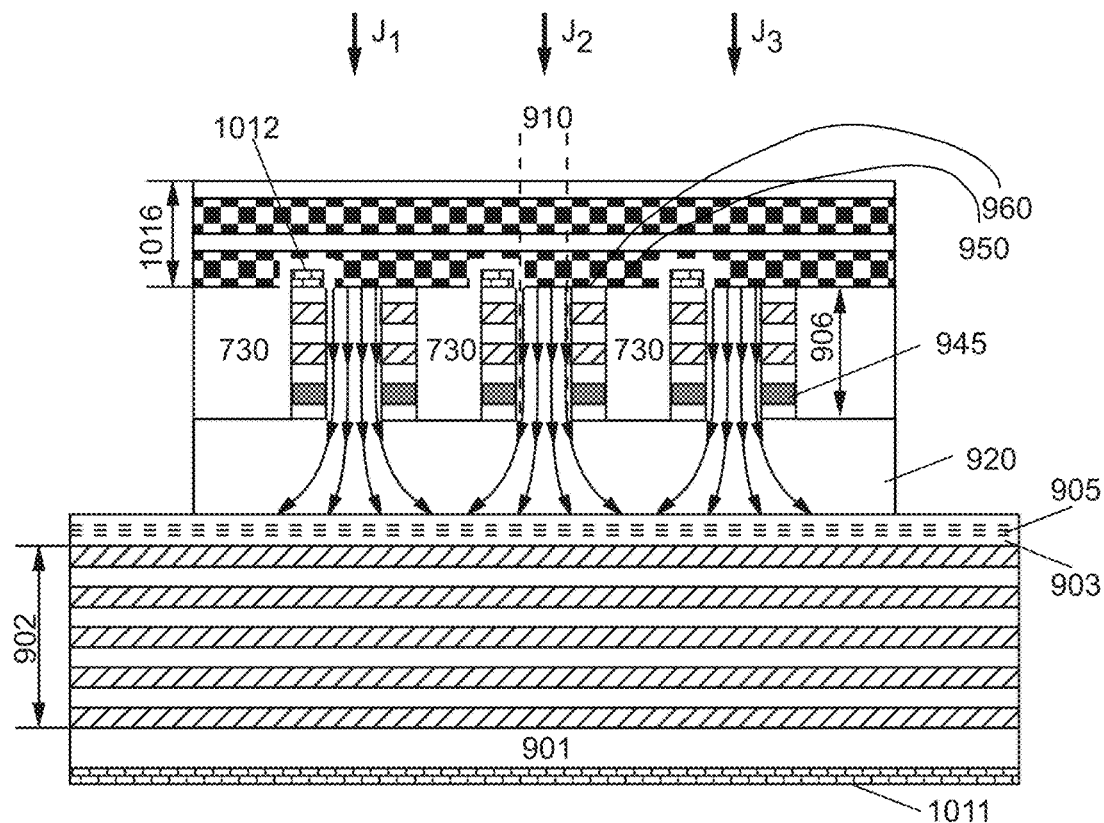
FIG. 12B shows schematically a vertical cross-section of a phase-coupled array of vertical cavity surface emitting lasers of FIGS. 11 and 12A, wherein such array is employed for the steering of the laser beam.

FIGS. 12A and 12B shows schematically an array of phase coupled VCSELs, which is used for beam steering. FIG. 12A repeats FIG. 11, and contains additionally a line (1050) which defines a vertical plane.

FIG. 12B shows schematically a cross-section of the array of phase-coupled VCSELs (900) in the vertical plane defined by the line (1050). The top contact (1012) is deposited on the top surface of the array, except the holes (950). The contact area (910) is depicted in FIG. 12B as three parts that are not electrically connected. All VCSELs are formed on a single wafer grown on a substrate (901) and contacting a common bottom DBR (902). Further each VCSEL has an electrically isolated mesa, which contains the oxide-confined aperture (945) and the top semiconductor DBR (906). Dielectric (730) is deposited between the mesas for planarization of the structure. Through each individual VCSEL, an independent current ($J_1$, $J_2$, or $J_3$) flows. The paths of the current through neighboring sections is separated by the chemically transformed regions (960). The current spreads in the spreading layer (920) and reaches the active cavity (903), in which the active medium (905) is placed. The bottom contact (1011) is preferably formed as a single contact for the whole array. The array of VCSELs (900) is capable to emit a phase coupled laser light. The VCSELs are coupled through the surface-trapped optical mode in the dielectric DBR (1016). The individually controllable currents ($J_1$, $J_2$, or $J_3$) control the phase of the phase-coupled optical field of the laser light, and, hence, the direction, the vertical or tilted at a controlled angle, of the emitted coherent laser beam.

A one skilled in the art will appreciate, that, similar to an array of circular holes (950), and array of elongated holes can be formed. This array can be configured such that it fixes polarization of a polarized laser light emitted by the array.

A one skilled in the art will further appreciate that an array similar to that of FIGS. 11 and 12 can be configured such that each pumped area of the array does not generate laser light but operates as a light-emitting diode or a gain chip. Then, once put into an external cavity, the array will generate laser light, similar to a Vertical-External-Cavity Surface-Emitting Laser (VECSEL).

Figure 14:
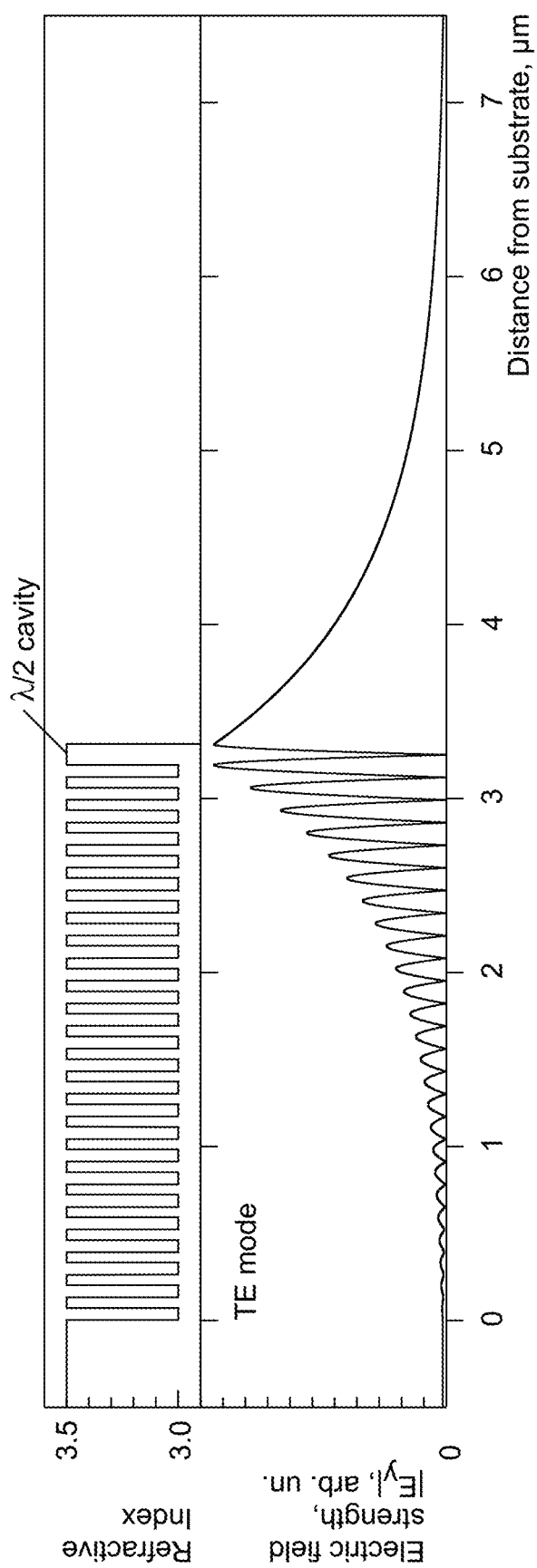
FIG. 14. Refractive index profile of a semiconductor DBR, additionally containing an effective lambda/2-cavity at the DBR surface and the electric field profile of a TE optical mode localized at the surface of the structure.

So far only TM-polarized surface-trapped modes have been considered. In order to get a TE mode localized at the surface, as strong modification of the structure is needed. FIG. 14 illustrates that addition of an effective "lambda/2" cavity on top of the DBR, i. e., having the topmost layer equal $\lambda_0/(2n_1)$ enables localization of a TE mode on the surface of the structure.

In a further embodiment of the present invention the same approach is applied to a tilted wave laser disclosed in the U.S. Pat. No. 7,421,001 "EXTERNAL CAVITY OPTO-ELECTRONIC DEVICE", filed Jun. 16, 2006, issued Sep. 2, 2008, and U.S. Pat. No. 7,583,712 "OPTOELECTRONIC DEVICE AND METHOD OF MAKING SAME", filed Jan. 3, 2007, issued Sep. 1, 2009, both by the inventors of the present invention, wherein these patents are hereby incorporated herein by reference. The approach disclosed in the present patent application enables fabrication of single transverse mode titled wave lasers.

In a further embodiment of the present invention, oxide-confined optoelectronic device is a resonant cavity light-emitting diode.

In another embodiment of the present invention, oxide-confined optoelectronic device is a resonant cavity superluminescent light-emitting diode.

In another embodiment of the present invention the approach disclosed in the present patent application is applied to a semiconductor disc laser.

In yet another embodiment of the present invention the approach disclosed in the present patent application can be applied to a single photon emitter.

In a further embodiment of the present invention the approach disclosed in the present patent application is applied to an emitter of entangled photons.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

Although the invention has been illustrated and described with respect to exemplary embodiments thereof, it should be understood by those skilled in the art that the foregoing and various other changes, omissions and additions may be made therein and thereto, without departing from the spirit and scope of the present invention. Therefore, the present invention should not be understood as limited to the specific embodiments set out above but to include all possible embodiments which can be embodied within a scope encompassed and equivalents thereof with respect to the feature set out in the appended claims.

What is claimed is:
1. An optoelectronic device comprising
a) a first multilayer distributed Bragg reflector bounded from the top by a homogeneous medium having a refractive index lower than the refractive index of the topmost layer of said first multilayer reflector,
wherein said first multilayer distributed Bragg reflector localizes a first optical mode;

wherein said first optical mode is a TM-polarized surface-trapped optical mode;
wherein said first optical mode
  i) is localized at a boundary between said first multilayer distributed Bragg reflector and said homogeneous medium, and
  ii) exhibits an evanescent decay in said homogeneous medium away from said boundary, and
  iii) exhibits an oscillatory decay in said first multilayer distributed Bragg reflector away from said boundary; and
b) a multilayer structure contiguous to said first multilayer distributed Bragg reflector at the side opposite to said homogeneous medium;
  wherein said multilayer structure localizes a second optical mode;
  wherein said multilayer structure further comprises an active medium;
wherein said first optical mode and said second optical mode exist at a same wavelength of light;
wherein a non-zero overlap integral exists between said first optical mode and said second optical mode;
wherein said non-zero overlap integral is above ten percent.

2. The optoelectronic device of claim 1,
further comprising a first domain and a second domain,
wherein said second domain is contiguous to said first domain in the lateral plane;
wherein the refractive index in said first domain has a first vertical profile;
wherein the refractive index in said second domain has s second vertical profile;
wherein said second vertical profile of the refractive index is distinct from said first vertical profile of the refractive index in at least one layer; and
wherein said non-zero overlap integral exists between the vertical profile of said first optical mode in said first domain and the vertical profile of said second optical mode in said second domain.

3. The optoelectronic device of claim 1,
wherein said homogeneous medium is selected from the group consisting of
  i) a dielectric material, and
  ii) air.

4. The optoelectronic device of claim 2,
wherein said first domain and said second domain are formed by a means selected from the group of means consisting of:
i) selective oxidation of a single semiconductor layer or a plurality of semiconductor layers resulting in the formation of a single oxide layer or a plurality of oxide layers,
ii) selective chemical etching of a single semiconductor layer or a plurality of semiconductor layers resulting in the formation of a single air gap or a plurality of air gaps,
iii) selective oxidation of i) followed by the oxide removal resulting in the formation of a single air gap or a plurality of air gaps,
iv) alloy composition intermixing, and
v) any combination of i) through iv).

5. The optoelectronic device of claim 1,
wherein said first multilayer Distributed Bragg reflector is selected from the group consisting of:
  i) semiconductor multilayer structure,
  ii) dielectric multilayer structure,
  iii) a multilayer structure with a high contrast in refractive index between at least one semiconductor layer and at least one oxide layer, and
  iv) any combination of i) through iii).

6. The optoelectronic device of claim 1,
wherein said first multilayer distributed Bragg reflector is selected from the group consisting of:
  i) a periodic structure,
  ii) a combination of two or more contiguously placed periodic structures,
  iii) a periodic structure contiguos to an additional layer,
  iv) a periodic structure contiguous to an aperiodic structure, and
  v) an aperiodic structure.

7. The optoelectronic device of claim 1,
wherein said multilayer structure further comprises
  i) a second multilayer distributed Bragg reflector contiguous to said first multilayer distributed Bragg reflector,
  ii) a resonant cavity contiguous to said second multilayer distributed Bragg reflector at a side opposite to said first multilayer distributed Bragg reflector, and
  iii) a third multilayer distributed Bragg reflector contiguous to said resonant cavity at a side opposite to said second multilayer distributed Bragg reflector.

8. The optoelectronic device of claim 1,
wherein said non-zero overlap integral is above ten percent.

9. The optoelectronic device of claim 8,
wherein said non-zero overlap integral is above twenty percent.

10. The optoelectronic device of claim 1, further comprising
c) a means of generation non-equilibrium carriers in said active medium.

11. The optoelectronic device of claim 10,
wherein said means of generating of non-equilibrium carriers is selected from the group consisting of:
  (i) current injection,
  (ii) photoexcitation, and
  (iii) electron beam excitation.

12. The optoelectronic device of claim 1,
wherein said optoelectronic device operates as a single transverse mode optoelectoronic device.

13. The optoelectronic device of claim 1, further comprising a p-n junction,
wherein said active medium is located within said p-n junction.

14. The optoelectronic device of claim 1,
wherein said active medium is selected from a group consisting of:
  i) a bulk material,
  ii) single or multiple quantum well,
  iii) single or multiple sheet of quantum wires,
  iv) single or multiple sheet of quantum dots, and
  v) any combination of i) through iv).

15. The optoelectronic device of claim 1,
wherein a semiconductor materials used for the fabrication of said optoelectronic device are selected from the group consisting of:
  (i) III-V materials,
  (ii) III-N materials,
  (iii) II-VI materials,
  (iv) group IV materials, and
  (v) any combination of (i) through (iv).

16. The optoelectronic device of claim 1,
wherein said optoelectronic device is selected from the group consisting of:

(i) resonance cavity light-emitting diode;
(ii) resonance cavity superluminescent light-emitting diode;
(iii) vertical cavity surface-emitting laser;
(iv) resonance cavity photodetector;
(v) tilted wave laser diode;
(vi) tilted cavity laser diode;
(vii) passive cavity surface-emitting laser;
(viii) single photon emitter;
(ix) emitter of entangled photons;
(x) semiconductor gain chip;
(xi) semiconductor optical amplifier; and
(xii) edge-emitting laser.

17. The optoelectronic device of claim 16,
wherein said optoelectronic device is a vertical cavity surface-emitting laser; and
wherein said vertical cavity surface-emitting laser operates in a single transverse optical mode.

18. The optoelectronic device of claim 16,
wherein said optoelectronic device is an edge-emitting laser;
wherein said first multilayer distributed Bragg reflector is a dielectric multilayer distributed Bragg reflector;
wherein said dielectric multilayer distributed Bragg reflector further comprises
two in-plane reflecting elements capable to reflect in-plane propagating light,
wherein said two in-plane reflecting elements are oriented parallel to each other and perpendicular to the lateral plane;
wherein a first in-plane reflecting element is selected from the group consisting of:
i) a cleaved front facet, and
ii) a front in-plane distributed Bragg reflector; and
wherein a second in-plane reflecting element is selected from the group consisting of:
iii) a cleaved rear facet, and
iv) a rear in-plane distributed Bragg reflector.

19. An optical integrated circuit, comprising
(i) at least one first optoelectronic device according to claim 1, and
(ii) a planar optical waveguide.

20. The optical integrated circuit of claim 19,
wherein said at least one first optoelectronic device according to claim 1 is a vertical cavity surface-emitting laser; and
wherein said optical integrated circuit operates as an optical amplifier for light propagating along said planar optical waveguide.

21. The optical integrated circuit of claim 19, further comprising
at least one second optoelectronic device according to claim 1,
wherein said at least one first optoelectronic device according to claim 1 is a vertical cavity surface-emitting laser; and
wherein said at least one second optoelectronic device according to claim 1 is a resonance cavity photodetector.

22. The optoelectronic device of claim 1 grown epitaxially on a substrate.

23. An array of optoelectronic devices comprising at least two optoelectronic devices of claim 1,
wherein each of said at least two optoelectronic devices is a vertical cavity surface-emitting laser; and
wherein the optical fields of said at least two optoelectronic devices are coherently optically coupled with each other.

24. The array of optoelectronic devices of claim 23,
wherein said array of optoelectronic devices is employed for the steering of a laser beam.

25. The array of optoelectronic devices of claim 23,
wherein all optoelectronic devices forming said array are positioned on a single wafer.

26. The array of optoelectronic devices of claim 23,
wherein said array of optoelectronic devices is further positioned in an external cavity.

27. The array of optoelectronic devices of claim 23, wherein each of the optoelectronic devices is configured so that
generated or amplified light propagates in a plane parallel to said boundary between said first multilayer distributed Bragg reflector and said homogeneous medium.

\* \* \* \* \*